U S009786376B2

United States Patent
Wang (10) Patent No.: US 9,786,376 B2
(45) Date of Patent: Oct. 10, 2017

(54) NON-VOLATILE SEMICONDUCTOR MEMORY DEVICE AND ERASING METHOD THEREOF

(71) Applicant: Winbond Electronics Corp., Taichung (TW)

(72) Inventor: Pin-Yao Wang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/140,509

(22) Filed: Apr. 28, 2016

(65) Prior Publication Data

US 2017/0133094 A1   May 11, 2017

(30) Foreign Application Priority Data

Nov. 10, 2015   (JP) .................................. 2015-220506

(51) Int. Cl.
  *G11C 16/16*   (2006.01)
  *G11C 16/04*   (2006.01)
  *G11C 16/32*   (2006.01)

(52) U.S. Cl.
  CPC .......... *G11C 16/16* (2013.01); *G11C 16/0483* (2013.01); *G11C 16/32* (2013.01)

(58) Field of Classification Search
  CPC ........................... G11C 16/16; G11C 16/0483
  See application file for complete search history.

(56) References Cited

U.S. PATENT DOCUMENTS

| 9,019,764 | B2 | 4/2015 | Lee et al. |
| 9,245,628 | B2* | 1/2016 | Maejima ............ G11C 16/0483 |
| 2009/0175081 | A1* | 7/2009 | Kim ....................... G11C 16/16 |
| | | | 365/185.11 |
| 2011/0049477 | A1* | 3/2011 | Meng ................... C07D 493/04 |
| | | | 257/40 |

FOREIGN PATENT DOCUMENTS

| JP | 2000322893 | 11/2000 |
| JP | 2012027979 | 2/2012 |
| JP | 2014032738 | 2/2014 |
| JP | 5550609 | 7/2014 |

OTHER PUBLICATIONS

"Office Action of Korean Counterpart Application," dated Jan. 11, 2017,with English translation thereof, p. 1-p. 8.
Masaru Yano et al., "Non-Volatile Semiconductor Memory Device", Unpublished U.S. Appl. No. 15/141,812, filed Apr. 28, 2016.

* cited by examiner

*Primary Examiner* — Douglas King
(74) *Attorney, Agent, or Firm* — Jianq Chyun IP Office (57) ABSTRACT

A non-volatile semiconductor memory device achieving low power consumption and erasing method thereof is provided. The flash memory of the present invention includes a memory array formed with NAND type strings. The memory array includes a plurality of global blocks, one global block includes a plurality of blocks, and one block includes a plurality of NAND type strings. When the block of the selected global block is erased and the next block is in adjacent relationship, electric charge accumulated in one of P-wells is discharged to another one of the P-wells, and then the next selected block is erased. Thus, the electric charge is shared between the adjacent P-wells to achieve low power consumption.

13 Claims, 11 Drawing Sheets

NON-VOLATILE SEMICONDUCTOR MEMORY DEVICE AND ERASING METHOD THEREOF

CROSS-REFERENCE TO RELATED APPLICATION

This application claims the priority benefit of Japan application serial no. 2015-220506, filed on Nov. 10, 2015. The entirety of the above-mentioned patent application is hereby incorporated by reference herein and made a part of this specification.

BACKGROUND OF THE INVENTION

Field of the Invention

The invention relates to a non-volatile semiconductor memory device, especially relates to a storage device having NAND type string and an erasing method thereof.

Description of Related Art

Flash memory is a memory element that is applied to a wide variety of electronic equipments, such as digital camera, smartphone, etc. In the market, the flash memory is further required to be small in volume and large in capacity, and is further required to have high speed and low power consumption.

The NAND type flash memory has a memory array configured to have a plurality of blocks, the block is formed by configuring a plurality of NAND strings in column direction. The NAND string is formed by a plurality of memory cells connected in series and select transistors connected to two ends of the series, wherein one end is connected to the bit line via a bit line side select transistor, and another end is connected to the source line via a source line side select transistor.

In the NAND type flash memory, data erasing is executed in block units. At this point, the word line of the selected block is set as 0V or lower than P-well voltage, a long positive voltage erase pulse is applied to the P-well forming the memory cell array, and after the erase pulse is applied, the electric potential of the P-well is restored to 0V. After erasing, by verifying read-out, the threshold value of the memory cell inside the selected block is determined whether to be smaller than a specific value. If the threshold value of all of the cell units inside the block is smaller than the specific value, the erase operation is completed, but if the threshold value of a part of the cell units is higher than the specific value, the erase pulse PS is applied again and the verifying read-out is executed again (such as Japan patent publication 2012-027979).

In the future, along with the popularity of internet devices, power consumption of the electronic equipment is restricted, and high-speed data communication between electronic equipments is desired. Consequently, the flash memory powered by the electronic equipment is also further required to have low power consumption.

SUMMARY OF THE INVENTION

The purpose of the invention is to provide a non-volatile semiconductor memory device that achieves low power consumption.

The non-volatile semiconductor memory device of the invention includes a memory array having a plurality of global blocks, wherein one global block includes a plurality of blocks, one block includes a plurality of NAND type strings, and each of the plurality of global blocks is respectively formed inside a well; a global block selecting component selecting one global block of the plurality of global blocks; a block selecting component selecting one block from the plurality of blocks inside the global block selected by the global block selecting component; and an erasing component erasing the block selected by the block selecting component, wherein the erasing component applies an erase voltage to a well of the selected global block and applies a reference voltage to a word line of the selected block, under a circumstance that the blocks of one of the wells are completely erased by the erasing component and the blocks of another one of the wells are erased, electric charge accumulated in the one of the wells is provided to the another one of the wells.

Preferably, the erasing component determines whether the one of the wells and the another one of the wells are in an adjacent relationship and when the adjacent relationship is determined, the electric charge of the one of the wells is discharged into the another one of the wells. Preferably, the one of the wells and the another one of the wells are in a predetermined relationship. Preferably, when the memory array includes a plurality of memory planes and each of the memory planes includes a plurality of global blocks, the one of the wells and the another one of the wells are located in the same memory plane. Preferably, when the memory array includes a plurality of memory planes and each of the memory planes includes a plurality of global blocks, the one of the wells and the another one of the wells are located in different memory planes. Preferably, the one of the wells and the another one of the wells are located at the same position in the different memory planes. Preferably, the erasing component erases the block of the one of the wells and the block of the another one of the wells at the same positions. Preferably, the erasing component includes a transistor connected between the selected wells of the plurality of wells, the erasing component discharges the electric charge of the one of the wells into another one of the wells via enabling the transistor. Preferably, the one of the wells is discharged from the erase voltage to a positive voltage, and the voltage of the another one of the wells is increased from the positive voltage by the shared electric charge.

The non-volatile semiconductor memory device of the invention includes a memory array having a plurality of wells, wherein a block including a NAND type string cell unit is formed in each of the wells; a block selecting component selecting the block; and an erasing component erasing the selected block, wherein the erasing component applies an erase voltage to the well of the selected block and applies a reference voltage to a word line of the selected block, under a circumstance that the block of one of the wells is completely erased by the erasing component and the block of another one of the wells is erased, electric charge accumulated in the one of the wells through the erase voltage is provided to the another one of the wells.

A erasing method of the present embodiment is an erasing method of a non-volatile semiconductor memory device, the non-volatile semiconductor memory device includes a memory array, the memory array includes a plurality of wells, a block including a NAND type string cell unit is formed in each of the wells, and the erasing method includes following steps: applying an erase voltage to one of the wells to erase a selected block; providing electric charge accumulated in the one of the wells through the erase voltage to another one of the wells; and applying the erase voltage to another one of the wells and erase the selected block. Preferably, the erasing method further includes a step that determining whether the one of the wells and the another one of the wells are in an adjacent relationship, under the circumstance that the adjacent relationship is determined, the one of the wells and the another one of the wells are electrically coupled.

According to the invention, under the circumstance that the block of one of the wells is completely erased by the erasing component and the block of another one of the wells is subsequently erased, and the electric charge accumulated in the one of the wells through the erase voltage are provided to another one of the wells, thus the erase voltage applying to the one of the wells is effectively used for the another one of the wells, so as to achieve reducing power consumption.

DESCRIPTION OF THE EMBODIMENTS

Embodiments of the invention are described in detail below with reference of figures. Moreover, it should be noticed that in the figures, some parts are emphasized for easy understanding and are not necessarily drawn to scale.

Figure 1:
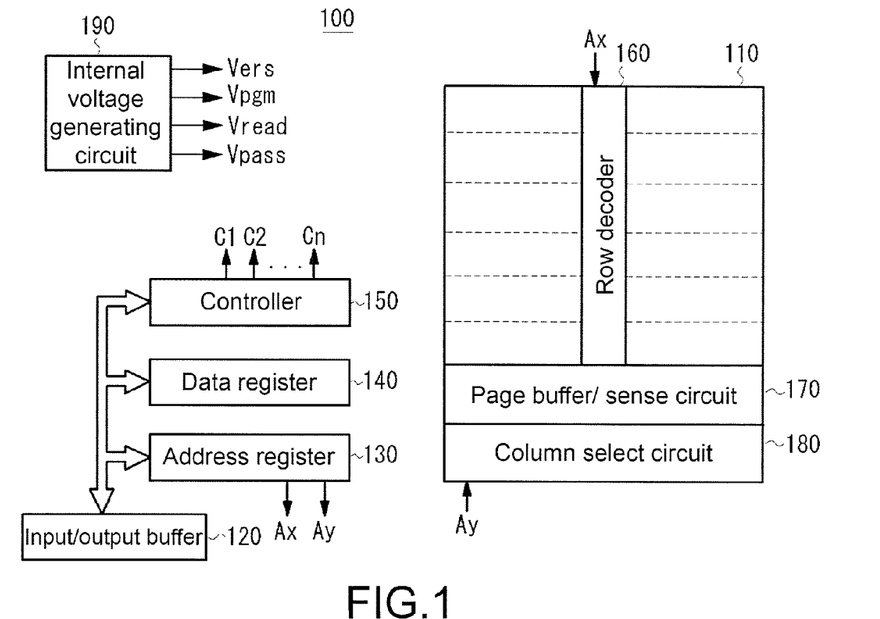
FIG. 1 is a diagram illustrating a schematic structure of a flash memory of an embodiment of the invention.

FIG. 1 is a block diagram illustrating the structure of a NAND type flash memory of an embodiment of the invention. A flash memory 100 in the present embodiment includes a memory array 110 having a plurality of memory cells arranged in a matrix; an input/output buffer 120 connected to the external input/output terminals I/O and maintaining input/output data; an address register 130 receiving address data from the input/output buffer 120; a data register 140 maintaining input/output data; a controller 150 providing control signals C1, C2, . . . Cn, wherein the control signals C1, C2, . . . Cn are used to control each part based on command data from the input/output buffer 120 and an external control signal (a chip enabling signal or an address latch enabling signal, etc., not shown); a row decoder 160 decoding a row address data Ax from the address register 130, wherein a decoding result is based on to select global block, block, word line, etc.; a page buffer/sense circuit 170 maintaining data read via the bit line or maintaining a program data via the bit line, etc.; a column select circuit 180 decoding a column address data Ay from the address register 130, wherein a decoding result is based on to select bit line, etc.; an internal voltage generating circuit 190 generating voltages required for data reading, data programming and data erasing, etc. (a program voltage Vpgm, a pass voltage Vpass, a read-out voltage Vread, and an erase voltage Vers, etc.).

Figure 2:
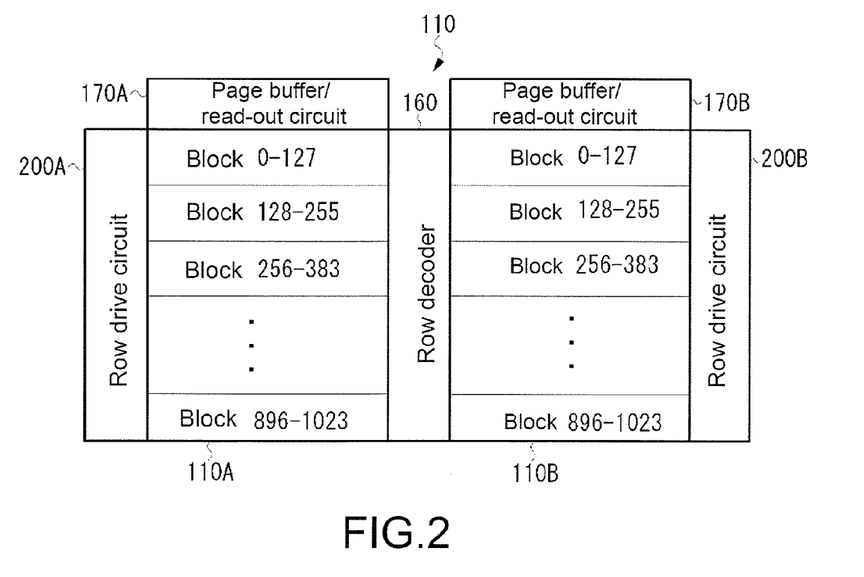
FIG. 2 is a diagram illustrating an entire structure of a memory array in the present embodiment.

FIG. 2 is a diagram illustrating the detailed structure of the memory array 110. The memory array 110 of the present embodiment is divided into two memory banks or two memory planes 110A and 110B. The memory plane 110A is coupled to a row drive circuit 200A, the memory plane 110B is coupled to a row drive circuit 200B, and the row decoder 160 is commonly coupled to the two memory planes 110A and 110B. In addition, as shown in FIG. 2, the top side of the memory plane 110A is configured to have a page buffer/sense circuit 170A, the top side of the memory plane 110B is configured to have a page buffer/sense circuit 170B, however, the page buffer/sense circuits 170A and 170B may also be configured at the bottom sides of the memory planes 110A and 110B.

The memory plane 110A includes a plurality of global blocks GBLK disposed along the column direction, similarly, the memory plane 110B may also include a plurality of global blocks GBLK disposed along the column direction. One global block GBLK further includes a plurality of blocks. As shown in FIG. 2, the memory plane 110A (or 110B) includes 8 global blocks GBLK along the column direction, one global block GBLK further includes 128 blocks BLK.

Figure 3:
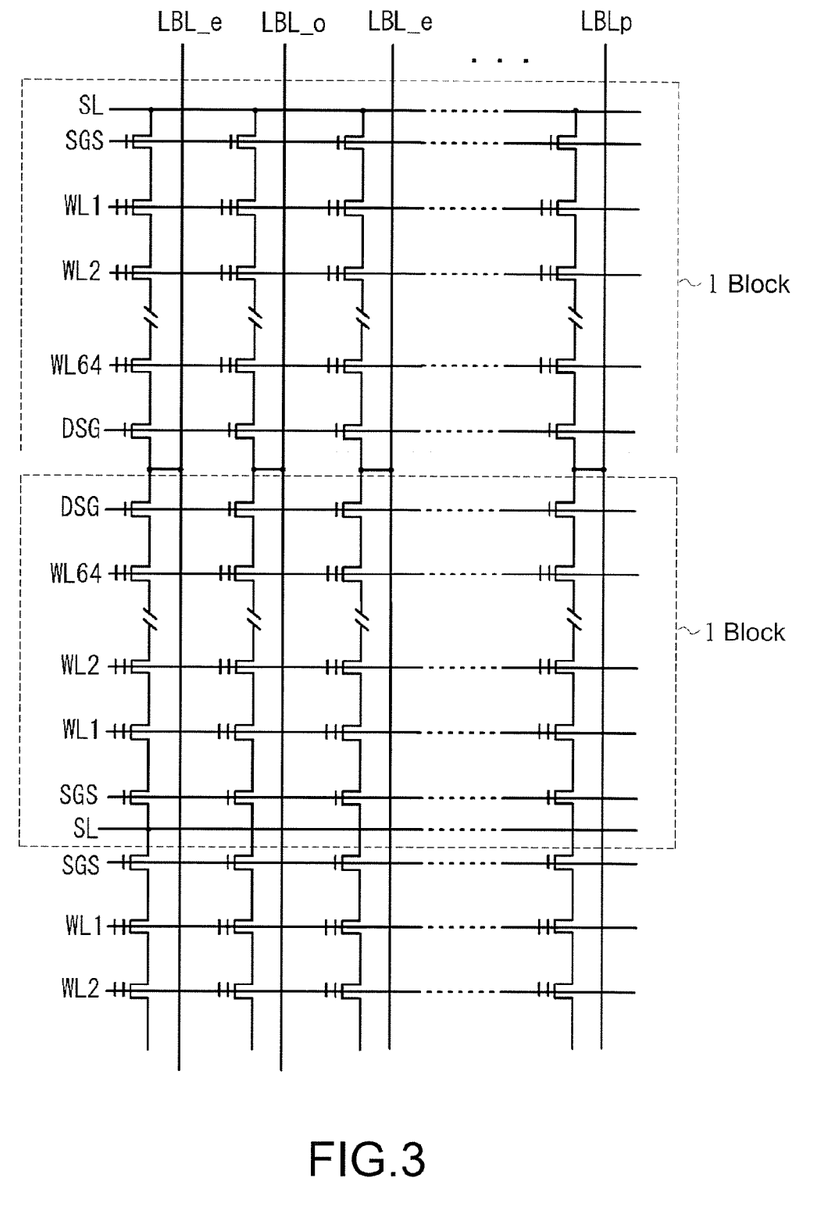
FIG. 3 is a diagram illustrating an equivalent circuit of a memory cell.

As shown in FIG. 3, a plurality of NAND strings are formed in one block BLK. One NAND string has a plurality of memory cells connected in series, a source line side select transistor connected with one end of the memory cell, and a bit line side select transistor connected with the other end of the memory cell. As shown in FIG. 3, one NAND string includes 64 memory cells connected in series. Namely, one block includes 64 page×p bit.

Typically, the memory cell has metal oxide semiconductor (MOS) structure, the MOS structure includes a source/drain serving as a N type diffusion region and formed in a P-well; a tunnel oxide film formed on a channel between the source and the drain; a floating gate (electric charge accumulating layer) formed on the tunnel oxide film; and a control gate formed on the floating gate with a dielectric film therebetween. When the floating gate does not accumulate electric charge, data "1" is written, the threshold value is in a negative state, and the memory cell is normally on. When the floating gate accumulates electrons, data "0" is written, the threshold value shifts to be positive, and the memory cell is normally off.

Figure 4:
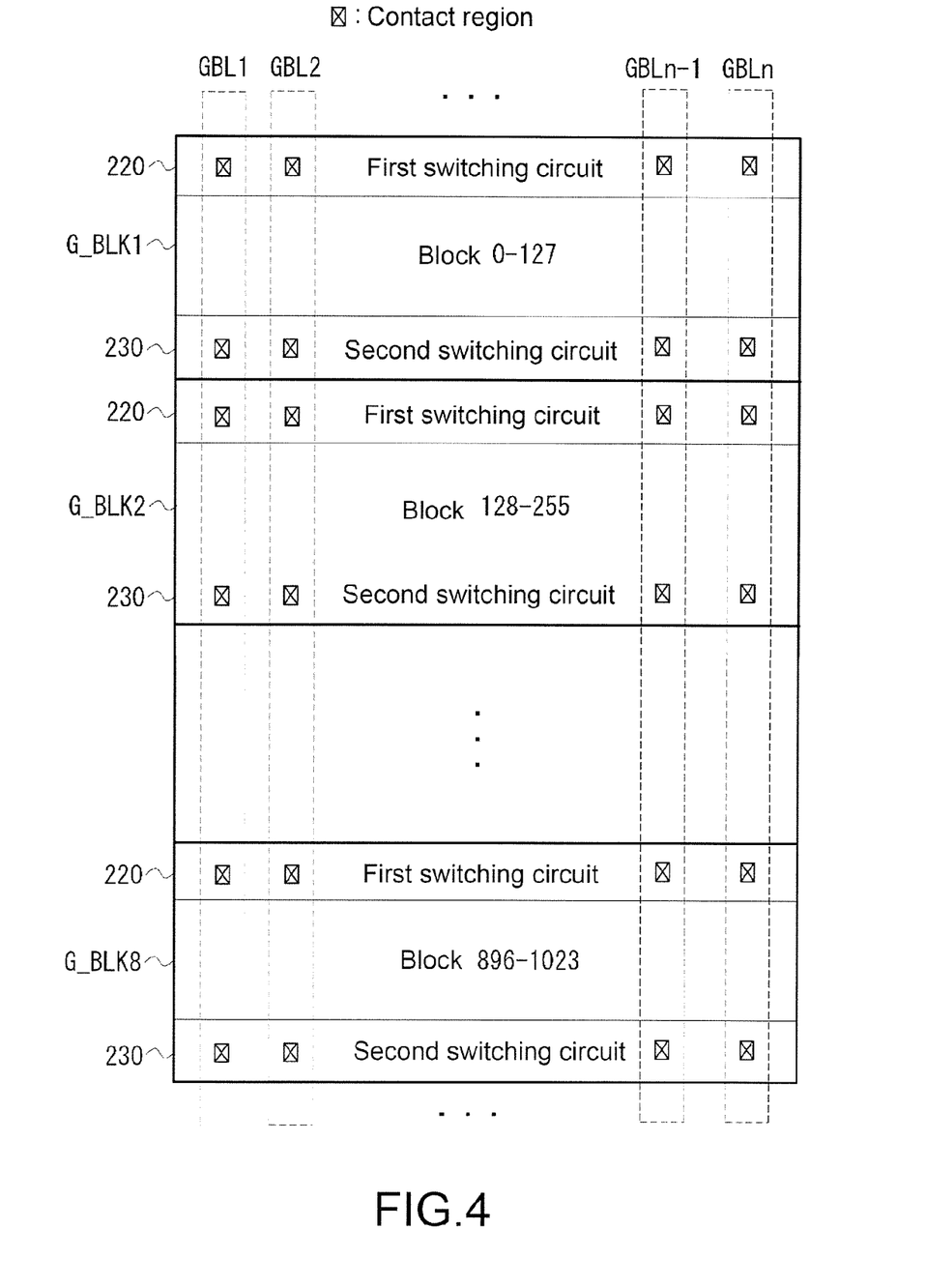
FIG. 4 is a diagram illustrating a schematic structure of a global block in the memory array of the present embodiment.

FIG. 4 is a plane view illustrating the schematic structure of the global block. As described above, one memory plane 110A (or 110B) includes 8 global blocks G_BLK1~G_BLK8 arranged along the column direction. Beside 128 blocks arranged along the column direction, the global block further includes a first switching circuit 220 and a second switching circuit 230. The first switching circuit 220 is disposed at the top end of the global block, the second switching circuit 230 is disposed at the bottom end of the global block, and 128 blocks are disposed between the first switching circuit 220 and the second switching circuit 230. In addition, n global bit lines GBL are formed above a plurality of global block G_BLK1~G_BLK8, each of the global bit lines GBL1~GBLn is shared by 8 global block G_BLK1~G_BLK8 and electrically connected to the first switching circuit 220 and the second switching circuit 230 of each of the global blocks via contacts.

Figure 5:
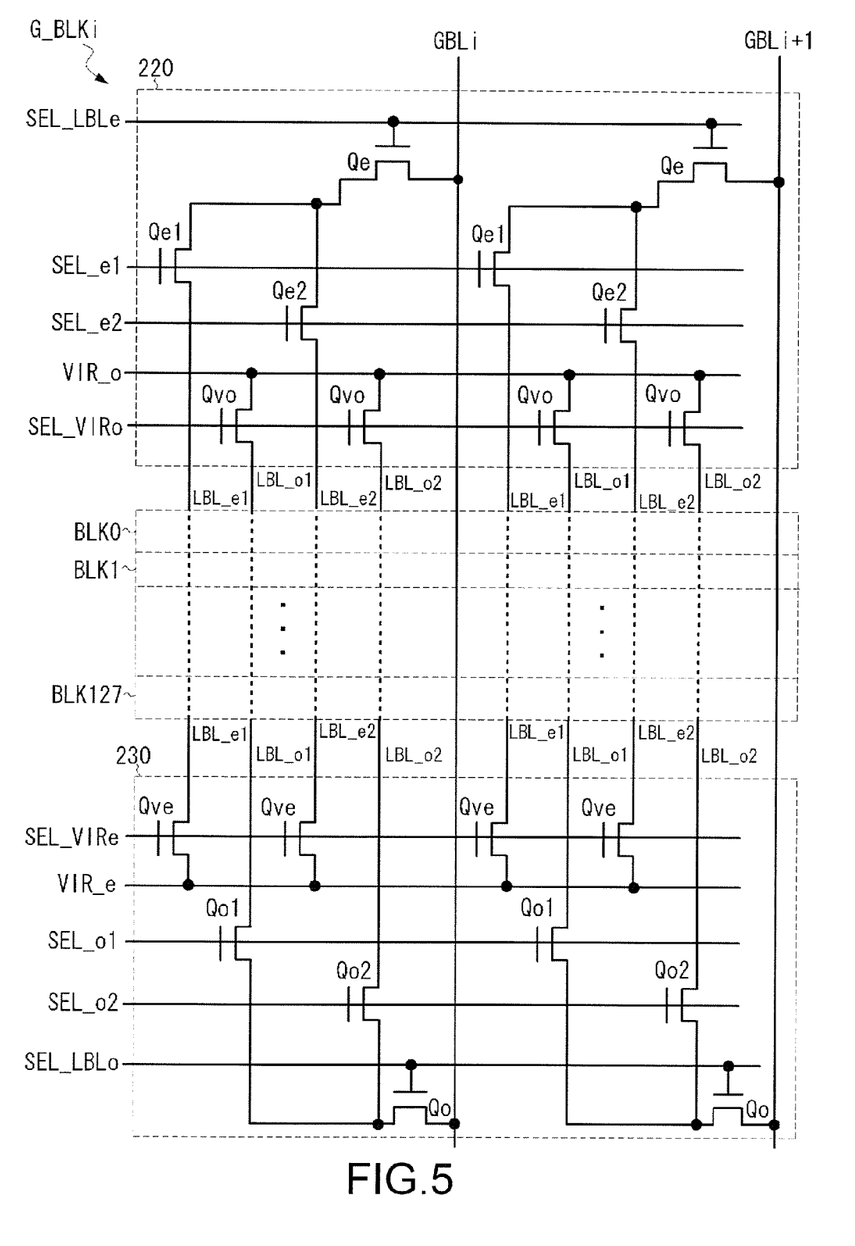
FIG. 5 is a diagram illustrating a circuit structure of switching circuits formed inside the global block of the present embodiment.

Next, FIG. 5 is a diagram illustrating the detailed circuit structure of the first switching circuit 220 and the second switching circuit 230. As a part of the structure, the ith global block G_BLKi is illustrated in FIG. 5, and the ith global bit line GBLi and the i+1th global bit line GBLi+1 are extended from above the ith global block G_BLKi. The structure related to the global bit line GBLi is the same as the structure related to the global bit line GBLi+1, thus only the global bit line GBLi is described hereinafter.

The global block G_BLKi includes 128 blocks along the column direction, one block, as shown in FIG. 3, includes a memory cell having 64 WL×p bit, one word line WL is allocated to have two pages being even-numbered and odd-numbered, thus one block has 128 pages. Each NAND string of each block is coupled to each local bit line LBL extended along the column direction. One local bit line LBL is shared by 128 blocks. Herein, under the circumstance that the local bit lines are even-numbered and odd-numbered for distinguishing, a symbol "LBL_e" is used to represent the even-numbered local bit line, and a symbol "LBL_o" is used to represent the odd-numbered local bit line.

In the present embodiment, one global bit line GBLi is selectively connected to two even-numbered local bit lines LBL_e and two odd-numbered local bit lines LBL_o, in other words, one global bit line is shared by four local bit lines. Each of the global bit lines GBL is connected with a page buffer/sense circuit 170. For example, when there are n global bit lines GBL, there are n page buffer/sense circuits 170 connected with global bit lines GBL. It is not shown in Figures but one page buffer/sense circuit 170 has latch circuits, the number of the latch circuits is corresponding to the number of local bit lines sharing one global bit line GBL (four is shown in FIG. 5), four latch circuits respectively maintain data read from the memory cells via four local bit lines LBL or respectively maintain data used for programming the memory cells via four local bit lines LBL.

The first switching circuit 220 includes N channel MOS transistors Qe, Qe1, Qe2, and Qvo. The transistor Qe connects the global bit line GBLi with the even-numbered local bit lines LBL_e1 and LBL_e2, the gate of the transistor Qe is connected to a select line SEL_LBLe, and the transistor Qe selects both the even-numbered local bit lines LBL_e1 and LBL_e2. The transistor Qe1 is serially connected between the local bit line LBL_e1 and transistor Qe, the gate of the transistor Qe1 is connected to a select line SEL_e1, the transistor Qe1 selects the even-numbered local bit line LBL_e1. The transistor Qe2 is serially connected between the local bit line LBL_e2 and transistor Qe, the gate of the transistor Qe2 is connected to a select line SEL_e2. The transistor Qe2 selects the even-numbered local bit line LBL_e2. The transistors Qvo connects an imaginary power line VIR_o with the odd-numbered local bit lines LBL_o1 and LBL_o2, and the gates of the transistors Qvo are collectively connected to a select line SEL_VIRo. The transistors Qvo provides bias voltages corresponding to operate condition to both odd-numbered local bit lines LBL_o1 and LBL_o2.

The second switching circuit 230 includes N channel MOS transistors Qo, Qo1, Qo2, and Qve. The transistor Qo connects the global bit line GBLi with the odd-numbered local bit lines LBL_o1 and LBL_o2, the gate of the transistor Qo is connected to a select line SEL_LBLo, and the transistor Qo selects both the even-numbered local bit lines LBL_o1 and LBL_o2. The transistor Qo1 is serially connected between the local bit line LBL_o1 and transistor Qo, the gate of the transistor Qo1 is connected to a select line SEL_o1, the transistor Qo1 selects the odd-numbered local bit line LBL_o1. The transistor Qo2 is serially connected between the local bit line LBL_o2 and transistor Qo, the gate of the transistor Qo2 is connected to a select line SEL_o2. The transistor Qo2 selects the odd-numbered local bit line LBL_o2. The transistors Qve connects an imaginary power line VIR_e with the even-numbered local bit lines LBL_e1 and LBL_e2, and the gates of which are collectively connected to a select line SEL_VIRe. The transistors Qve provides bias voltages corresponding to operate condition to both even-numbered local bit lines LBL_e1 and LBL_e2.

Figure 6A:
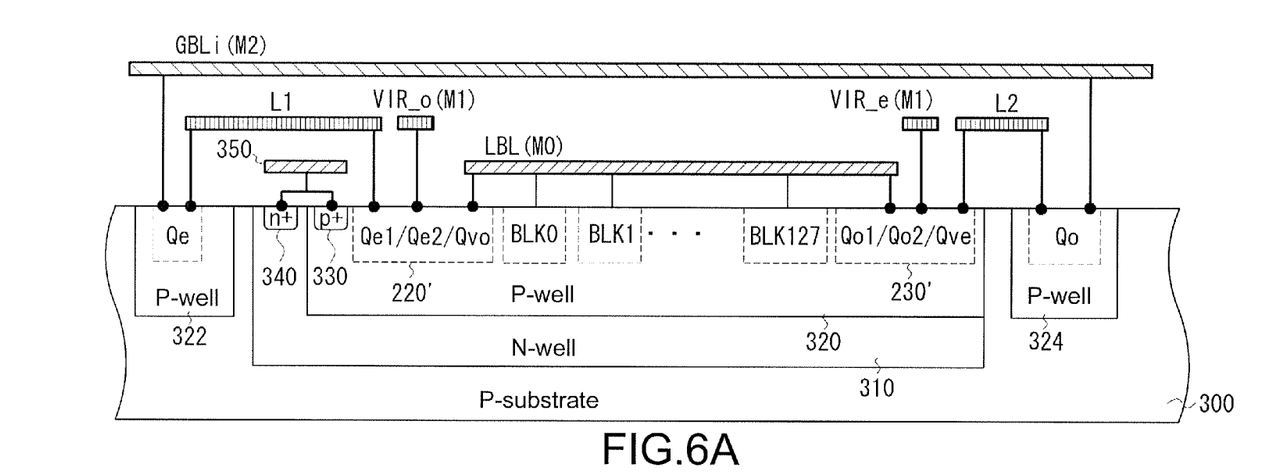
FIG. 6A is a cross-sectional view of the schematic structure of the global block in the present embodiment.
Figure 6B:
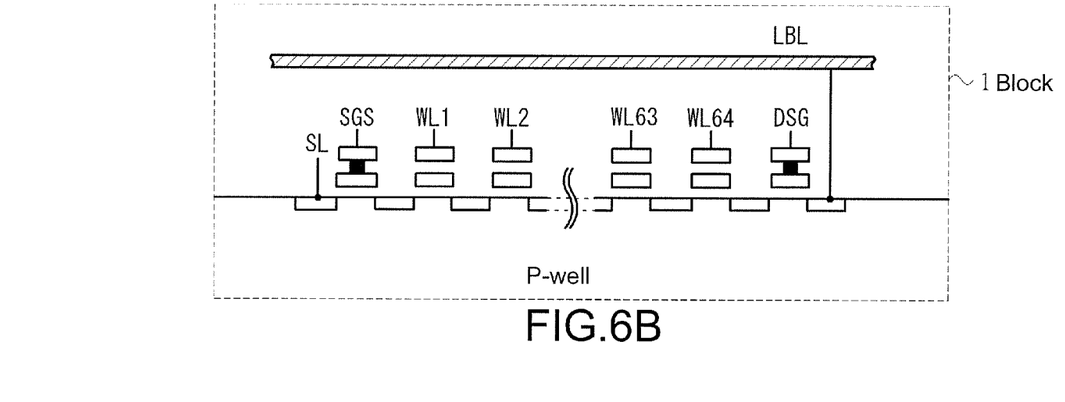
FIG. 6B is a cross-sectional view illustrating a connection relationship between a local bit line and a block.

FIG. 6A and FIG. 6B are schematic cross-sectional views of the global block. In one example, a N-well 310 is formed in a p-type silicon substrate 300, and a P-well 320 is formed in the N-well 310. Furthermore, P-wells 322 and 324 separate from the P-well 320 are formed in the p-type silicon substrate 300. The main part of one global block G_BLKi is formed in the P-well 320. The transistor Qe of the first switching circuit 220 is formed in the P-well 322 separate from the P-well 320, the transistor Qo of the second switching circuit 230 is formed in the P-well 324. In a preferred embodiment, the memory cells of each block and each of the transistors of the first switching circuit 220 and the second switching circuit 230 formed in the P-well 320 are formed by the same manufacturing process. Therefore, the micro machining similar to the micro machining that is performed on the memory cell is performed on the transistors of the first switching circuit 220 and the second switching circuit 230. On the other hand, the transistors Qe and Qo formed in the P-wells 322 and 324 are coupled between one global bit line and four local bit lines, when the transistors Qe and Qv is in the erase operation, the P-well 320 of the global block is blocked when the voltage state of the P-well 320 becomes a high voltage state, so as to prevent the global bit line GBL from having a high voltage.

Moreover, a p+diffusion area 330 used for contact is formed in the P-well 320, a n+diffusion area 340 is formed in the N-well 310, the diffusion areas 330 and 340 are connected to a common contact line 350 of the N-well/P-well. As described below, when the selected block is erased, an erase voltage Vers or an erase pulse generated by the internal voltage generating circuit 190 is applied to P-well 320 and N-well 310 via the common contact line 350. Otherwise, the impurity concentration of the P-wells 322 and 324 is either the same as the impurity concentration of the P-well 320 or different from the impurity concentration of the P-well 320 according to requirements.

As shown in FIG. 6B, the local bit line LBL is connected to the drain of the bit line side select transistor of each block, the local bit line LBL includes, for example, a first level metal line (M0). The common contact line 350 includes, for example, a first level metal line. The interconnection between a first switching circuit 220' and the transistor Qe and the interconnection between a second switching circuit 230' and the transistor Qo include, for example, a second level metal line L1 and a second level metal line L2 respectively. The imaginary power lines VIR_o and VIR_e, similar to the interconnections L1 and L2, includes a second level metal line (M1), for example. The global bit line GBLi includes, for example, a third level metal line (M2). In particular, the ideal resistance of the metal line forming the global bit line GBLi is as small as possible and desirably reduce the capacitance between adjacent global bit lines.

Figure 7A:
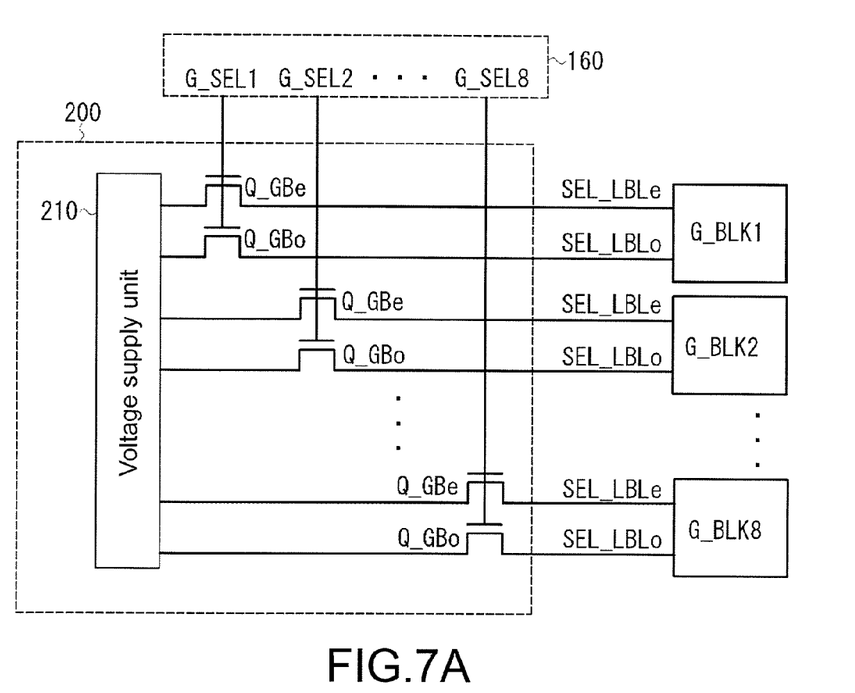
FIG. 7A is a diagram illustrating an exemplary structure of a row decoder used for selecting the global block in the present embodiment.

FIG. 7A is a diagram illustrating an exemplary structure of a row decoder 200 used for selecting the global block G_BLKi. The row drive circuit 200 includes 8 pairs of N type global block selecting transistors Q_GBe and Q_GBo connected to select lines SEL_LBLe and SEL_LBLo of each global block. Each of select lines G_SEL1, G_SEL2, . . . , G_SEL8 is provided from the row decoder 160 to the gates of each pair of global block selecting transistors Q_GBe and Q_GBo so as to select a global block. The row decoder 160 is based on the row address data Ax to set one of the select lines G_SEL1, G_SEL2, . . , G_SEL8 as H level (to turn on the global block selecting transistor) and to set the remaining select lines as L level (to turn off the global block selecting transistors), so the select lines SEL_LBLe and SEL_LBLo of the selected global block are electrically coupled to a voltage supply unit 210 of the row drive circuit 200. The voltage supply unit 210 provides voltages corresponding to operate condition to the select lines SEL_LBLe and SEL_LBLo of the selected global block.

Figure 7B:
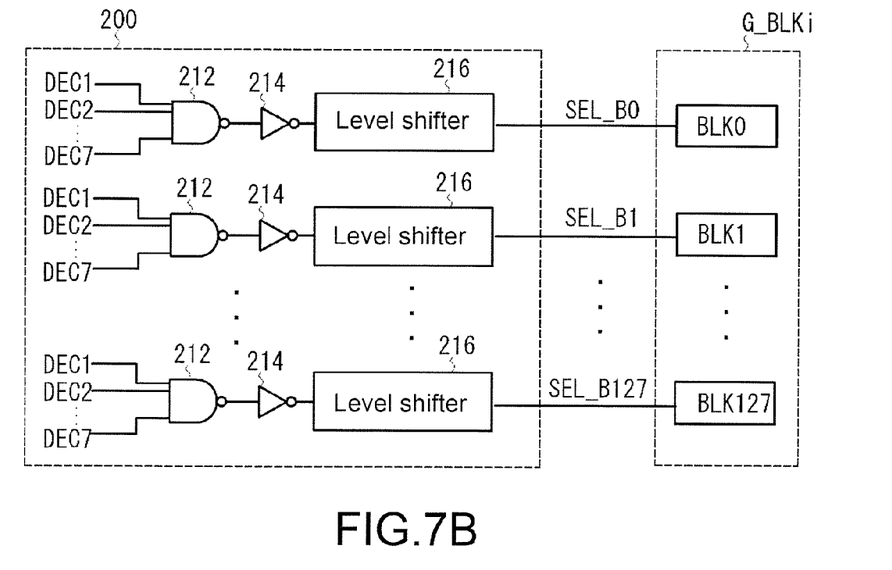
FIG. 7B is a diagram illustrating an exemplary structure of a row decoder used for selecting the block in the present embodiment.

FIG. 7B is a diagram illustrating an exemplary structure of the row decoder 200 used for selecting the block inside the global block. The row drive circuit 200 includes 128 groups, and one group includes a NAND gate 212, an inverter 214, and a level shifter 216. The row decoder 160 inputs 7 decoding signals DEC1, DEC2, . . . , DEC7 used for selecting block from the row decoder 160 to each of the NAND gates 212, and an output of one of the NAND gates 212 is L level. The output of the NAND gate 212 enables the level shifter 216 via the inverter 214 and drives one of block selecting lines SEL_B0, SEL_B1, SEL_B2, . . . , SEL_B127 to H level. It is not shown in Figures but each block includes N type block selecting transistors, and the gates of the block selecting transistors are connected to the block selecting lines SEL_B0, SEL_B1, SEL_B2, SEL_B127. Moreover, the row drive circuit 200 provides voltages corresponding to operate condition to select gate lines SGS and DSG, word lines WL1~WL64, a source line SL, the select lines SEL_e1, SEL_e2, SEL_VIRe, SEL_VIRo, SEL_o1, SEL_o2, and SEL_LBLo, the imaginary power lines VIR_o and VIR_e shown in FIGS. 4 and 5.

Figure 8:
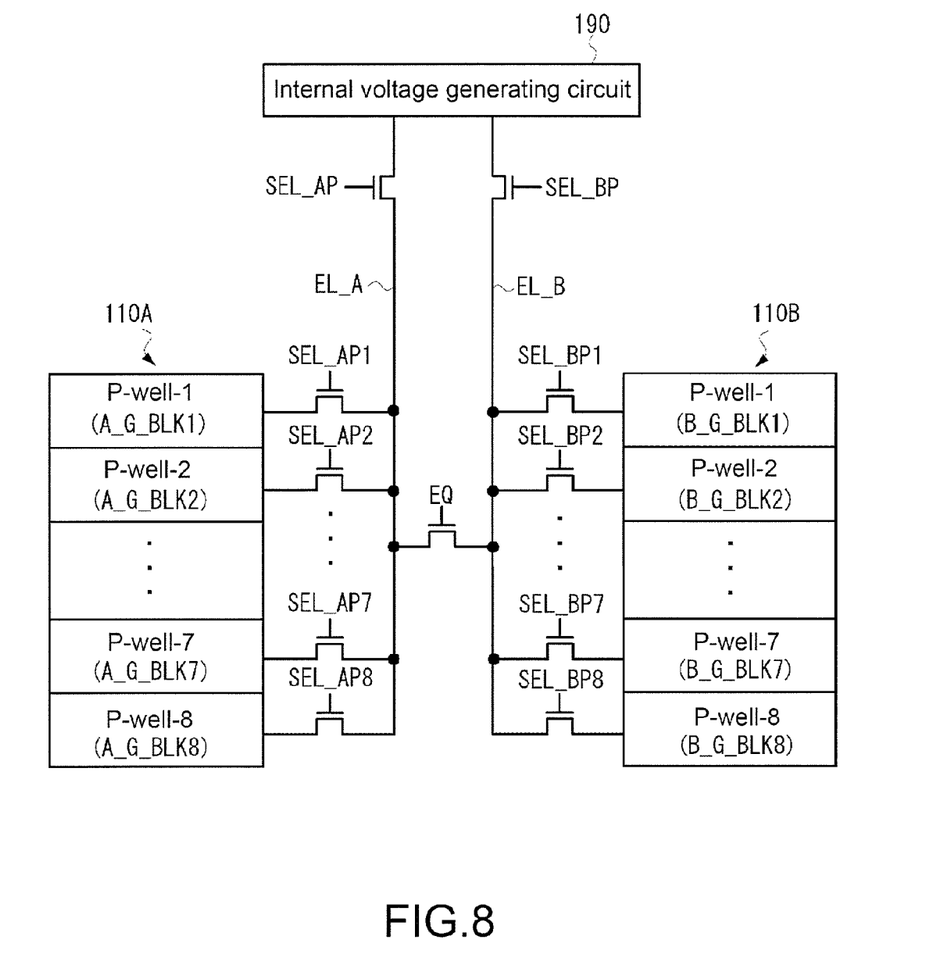
FIG. 8 is a schematic diagram illustrating a connection relationship between an internal voltage generating circuit and each P-well of a memory plane of the flash memory of the present embodiment.

Next, providing the erase voltage to each global block of the memory plane is described. FIG. 8 is a diagram illustrating a connection relationship of 8 P-wells 1-8 respectively corresponding to 8 global blocks of the memory plane 110A and 8 P-wells 1-8 respectively corresponding to 8 global blocks of the 8 P-wells 1-8 respectively corresponding to 8 global blocks of the memory plane 110B with the erase lines from the internal voltage generating circuit 190.

There are 8 global blocks A_G_BLK1, A_G_BLK2, . . . , A_G_BLK7, and A_G_BLK8 formed in the memory plane 110A, and there are 8 global blocks B_G_BLK1, B_G_BLK2, . . . , B_G_BLK7, and B_G_BLK8 formed in the memory plane 110B. As shown in FIG. 6A, one global block includes one P-well and 128 blocks are formed in one P-well. Moreover, the P-well 320 is connected to the contact line 350 as shown in FIG. 6A, and the erase voltage Vers generated by the internal voltage generating circuit 190 is applied to the contact line 350.

The contact lines 350 of the P-well-1~P-well-8 of the memory plane 110A are connected to an erase line EL_A via select transistors SEL_AP1, SEL_AP2, . . . , SEL_AP7, and SEL_AP8 respectively, the erase line EL_A is connected to the internal voltage generating circuit 190 via a transistor SEL_AP selected by the memory plane. Similarly, the contact lines 350 of the P-well-1~P-well-8 of the memory plane 110B are connected to an erase line EL_B via select transistors SEL_BP1, SEL_BP2, . . . , SEL_BP7, and SEL_BP8 respectively, the erase line EL_B is connected to the internal voltage generating circuit 190 via a transistor SEL_BP selected by the memory plane.

The select lines that are used for selecting the pair of the select lines SEL_LBLe and SEL_LBLo generated from the row drive circuit 200 to select the corresponding global block as shown in FIG. 7A are provided to the gates of the select transistors SEL_AP1, SEL_AP2, . . . , SEL_AP7, and SEL_AP8. Therefore, when the memory plane 110A is selected, the select line enabling one of the select transistors SEL_AP1, SEL_AP2, . . . , SEL_AP7, and SEL_AP8 is provided. Similarly, the select lines that are used for selecting the pair of the select lines SEL_LBLe and SEL_LBLo generated from the row drive circuit 200 to select the corresponding global block as shown in FIG. 7A are provided to the gates of the select transistors SEL_BP1, SEL_BP2, . . . , SEL_BP7, and SEL_BP8, when the memory plane 110B is selected, one of the select transistors SEL_BP1, SEL_BP2, . . . , SEL_BP7, and SEL_BP8 is turned on.

In addition, an equivalent transistor EQ is connected between the pair of erase lines EL_A and EL_B. A control signal from the controller 150 is provided to the gate of the equivalent transistor EQ, when the blocks are serially erased, the equivalent transistor EQ is turned on, so the electric charge accumulated in the P-well when the erase voltage Vers is applied is provided to the P-well of the block that is subsequently erased, and the electric charge is shared between the P-wells. The electric potential of the P-well of the block that is subsequently erased may be precharged to a source voltage Vcc or other voltages. For example, under the circumstance that a block of the global block A_G_BLK1 in the memory plane 110A is completely erased and a block of the global block B_G_BLK1 in the memory plane 110B is subsequently erased, the electric charge accumulated in P-well-1 of the memory plane 110A because of the erase voltage Vers is discharged to the P-well-1 having the source voltage Vcc of the memory plane 110B via the transistors SEL_AP1, EQ, and SEL_BP1. When the electric potentials of the two P-wells are substantially equal to each other, the transistor EQ becomes turned off, or L level control signal is provided to the gate of the transistor EQ.

In order to share the electric charge effectively between the P-wells, the loss of discharging the electric charge from one P-well to another P-well is reduced as much as possible desirably. Therefore, the electric charge is desirably shared between two P-wells in an adjacent relationship. In comparison with the P-wells not being in the adjacent relationship, the electric charge between the P-wells being in the adjacent relationship moves a shorter distance or the obstacle in movement of the electric charge is small. The adjacent relationship may be either between P-wells in the same memory plane or between P-wells in the adjacent memory planes. For example, when the P-well-1 and the P-well-2 of the same memory plane 110A are in the adjacent relationship, the electric charge of the P-well-1 is provided to the P-well-2 via the transistor SEL_AP1, the erase line EL_A, and the transistor SEL_AP2. Moreover, when the P-well-1 and the P-well-3 of the same memory plane 110A are in the adjacent relationship, the electric charge of the P-well-1 is provided to the P-well-3 via the transistor SEL_AP1, the erase line EL_A, and the transistor SEL_AP3. In another example, when the P-well-1 of the memory plane 110A and the P-well-1 of the memory plane 110B are in the adjacent relationship, the electric charge of the P-well-1 of the memory plane 110A is provided to the P-well-1 of the memory plane 110B via the transistor SEL_AP1, the erase line EL_A, the transistor EQ, the erase line EL_B, and the transistor SEL_BP1. Otherwise, when the P-well-1 of the memory plane 110A and the P-well-2 of the memory plane 110B are in the adjacent relationship, the electric charge of the P-well-1 of the memory plane 110A is provided to the P-well-2 of the memory plane 110B via the transistor SEL_AP1, the erase line EL_A, the transistor EQ, the erase line EL_B, and the transistor SEL_BP2. The adjacent relationship is predetermined, and when the blocks are serially erased, the controller 150 is based on the address of the selecting block to determine whether the P-wells are in the adjacent relationship.

Figure 8A:
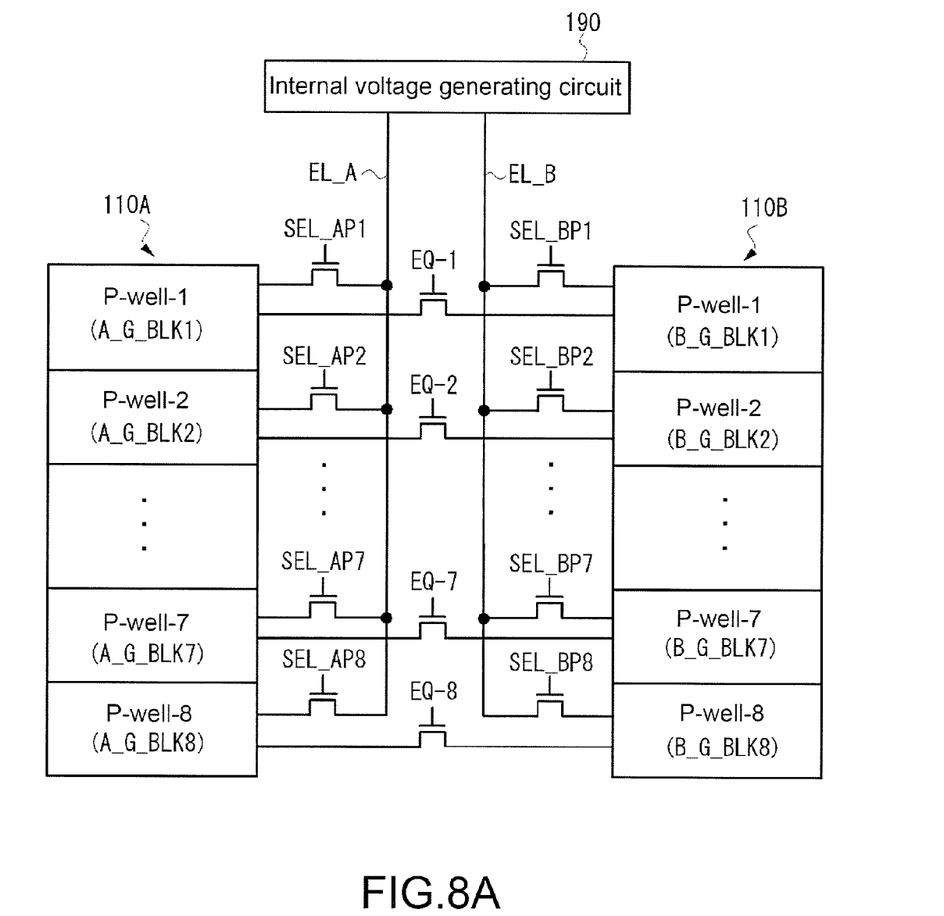
FIG. 8A is a schematic diagram illustrating another connection relationship between an internal voltage generating circuit and each P-well of the memory plane of the flash memory of the present embodiment.

FIG. 8A is a diagram illustrating another exemplary connection in the present embodiment. As shown in the structure in FIG. 8, the electric charge is shared between each P-well of the memory plane 110A and each P-well of the memory plane 110B by any combination, as the example shown n FIG. 8A, the electric charge is shared between the P-wells at the same position in the memory planes 110A and 110B. In the structure in FIG. 8A, the sequence is effective in erasing the P-wells at the same position in the memory planes 110A and 110B. To be more specific, in the following example sequence, when a selected block of the P-well-1 in the memory plane 110A is erased, a selected block (connecting to the word line of the block at the same position) at the same position in the P-well-1 of the memory plane 110B is subsequently erased.

As shown in FIG. 8A, each of the contact lines 350 of the P-well-1~P-well-8 in the memory plane 110A is connected to the internal voltage generating circuit 190 via the respective select transistor SEL_AP1, SEL_AP2, . . . SEL_AP7, SEL_AP8 and via the erase line EL_A. Similarly, each of the contact lines 350 of the P-well-1~P-well-8 in the memory plane 110B is connected to the internal voltage generating circuit 190 via the respective select transistor SEL_BP1, SEL_BP2, . . . SEL_BP7, SEL_BP8 and via the erase line EL_B. Furthermore, the contact line 350 of the P-well-1 in the memory plane 110A is connected to the contact line 350 of the P-well-1 in the memory plane 110B via a transistor EQ-1, similarly, transistors EQ-2, . . . , EQ-7, EQ-8 are respectively connected between the two P-wells-2, . . . , the two P-wells-8 of the the memory plane 110A and the memory plane 110B.

When the global block A_G_BLK1 is selected to erase the selected block inside and the global block B_G_BLK1 is also selected to erase the selected block inside, the transistor SEL_AP1 is turned on and the erase voltage Vers is applied to the P-well-1. When the selected block is completely erased, next, the transistor EQ-1 is turned on, the electric charge accumulated in the P-well-1 of the memory plane 110A is discharged to the P-well-1 of the memory plane 110B. When other P-wells are erased, similarly, the electric charge accumulated in the P-well on the left because of the erase voltage Vers is discharged to the P-well on the right which is precharged to the source voltage Vcc.

Next, the erase operation of the flash memory in the present embodiment is described. Table 1 represents the bias voltage of each part in erase operation. In the selected global block, a voltage Vdd is provided to the global bit line GBLi and the select lines SEL_LBLe and SEL_LBLo, otherwise, the select lines SEL_e1, SEL_e2, SEL_o1, SEL_o2, SEL_VIRe, and SEL_VIRo, the bit line LBLe and LBLo are set as floating, and the erase voltage 20V is applied to the P-well. In addition, L level (or 0V) is provided to the select lines SEL_LBLe and SEL_LBLo of the non-selected global blocks, the other select lines are set as floating.

TABLE 1

| | Selected global blok | Non-selected global block | Selected block | Non-selected block |
|---|---|---|---|---|
| GBLi | Vdd | — | — | |
| SEL_LBLe | Vdd | L | — | — |
| SEL_LBLo | Vdd | L | — | — |
| SEL_e1 | F | F | — | — |
| SEL_e2 | F | F | — | — |
| SEL_o1 | F | F | — | — |
| SEL_o2 | F | F | — | — |
| SEL_VIRe | F | F | — | — |
| SEL_VIRo | F | F | — | — |
| LBLe | F | F | — | — |
| LBLo | F | F | — | — |
| W/L | — | — | 0 V | F |
| DSG | — | — | F | F |
| SGS | — | — | F | F |
| SL | — | — | F | F |
| P-well | 20 V | — | 20 V | 20 V |

A voltage 0V is applied to all of the word lines WL of the selected block, the select lines DSG and SGS and the source line SL of the selected block are set as floating, and all of the word lines WL, the select lines DSG and SGS, and the source lines SL of the non-selected blocks are set as floating. In this way, the flash memory of the present embodiment is the same as the conventional flash memory that a block is a unit which is erased as a whole.

Figure 9:
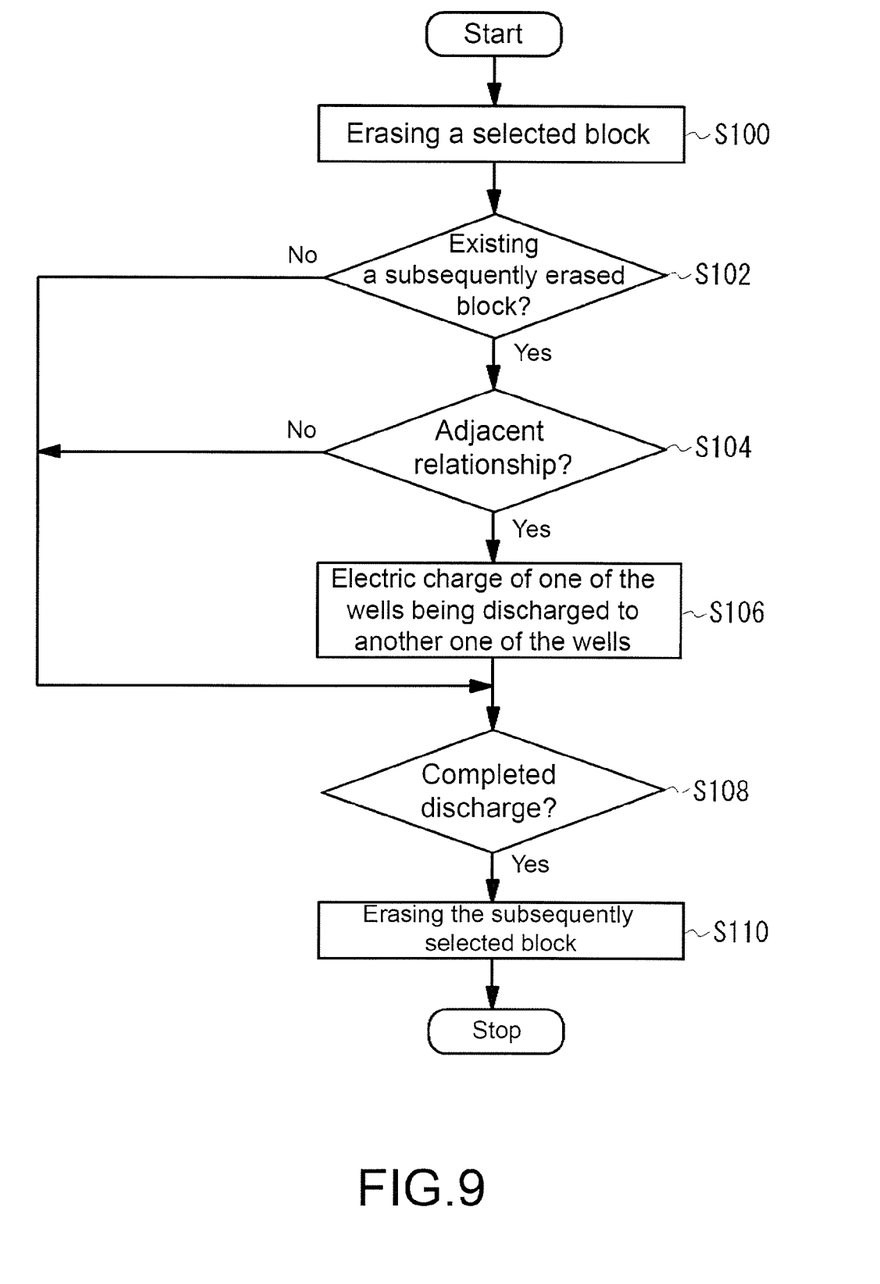
FIG. 9 is a flowchart illustrating an exemplary erase operation of the flash memory of the present embodiment.

Next, the process that the electric charge is shared when erasing is shown in FIG. 9. The process may be implemented in the structure shown in FIG. 8. When the input/output buffer 120 receives an erasing command, or according to the execution of the erase program of the chip level, etc., the controller 150 is used to erase a selected block (S100). When the selected block is completely erased, next, the controller 150 determines whether another block that needs to be subsequently erased exists (S102).

Under the circumstance that another block that needs to be subsequently erased exists, the controller 150 is based on the address infatuation of the blocks that need to be erased to determine whether the P-well including the block that is subsequently erased and the P-well including the block that is previously erased are in the adjacent relationship (S104). Under the circumstance that the adjacent relationship is determined, the controller 150 couples the P-well including the block that is previously erased to the P-well including the block that is subsequently erased, so as to discharge the electric charge accumulated in the P-well (S106). To be more specific, the electric charge is shared between the P-wells via controlling the transistors SEL_AP1, SEL_AP2, . . . , SEL_AP7, SEL_AP8, EQ, SEL_BP1, SEL_BP2, . . . , SEL_BP7, and SEL_BP8 to be turned on or turned off. The discharge of the electric charge of the P-well is the precharge of the P-well of the block that is subsequently erased.

When the discharge from one of the P-wells to another P-well is completed (S108), next, the controller 150 starts to erase the block that is subsequently erased (S110). A specific voltage is precharged in the P-well via sharing electric charge, so as to reduce the power needed to increase the voltage of the P-well to the erase voltage and simultaneously to shorten the time needed to increase the voltage to the erase voltage.

Figure 9A:
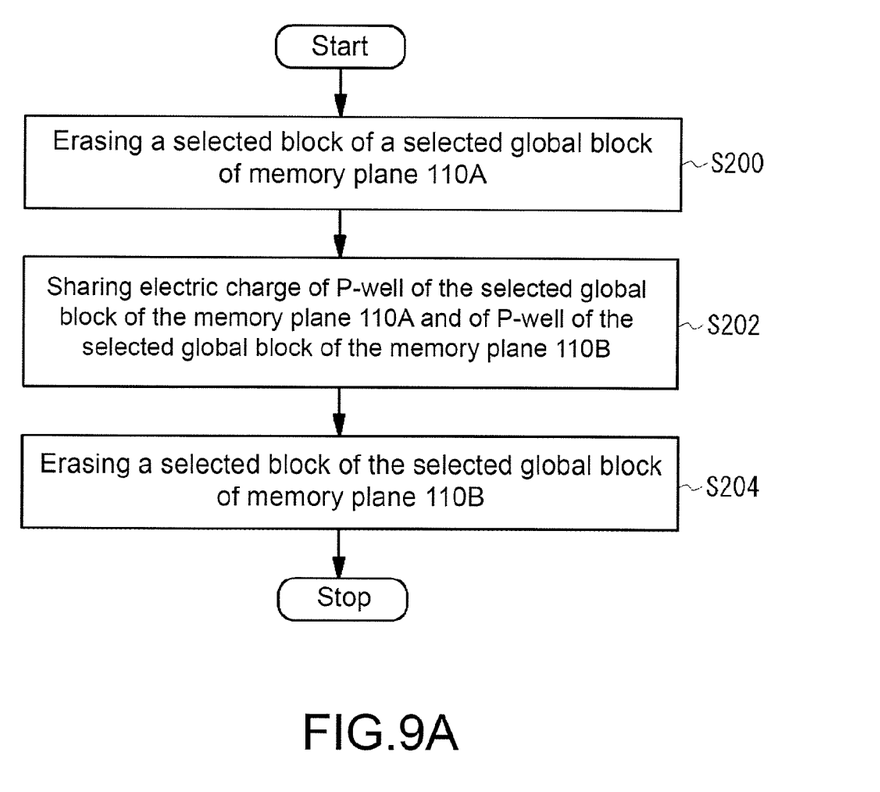
FIG. 9A is a flowchart illustrating another exemplary erase operation of the flash memory of the present embodiment.

FIG. 9A is another process to share the electric charge when erasing. The process may be implemented in the structure shown in FIG. 8A. Firstly, the selected block of the selected global block of the memory plane 110A of the left is erased (S200), next, the equivalent transistor between the P-well of the selected global block of the memory plane 110A and the P-well of the selected global block of the memory plane 110B is turned on, the electric charge is shared between the two P-wells (S202). Next, the selected block of the selected global block of the memory plane 110B is erased (S204). In this process, unlike the process in FIG. 9, it is not necessary to determine whether the block that is subsequently erased exists (S102) and to determine the adjacent relationship (S104).

Figure 10:
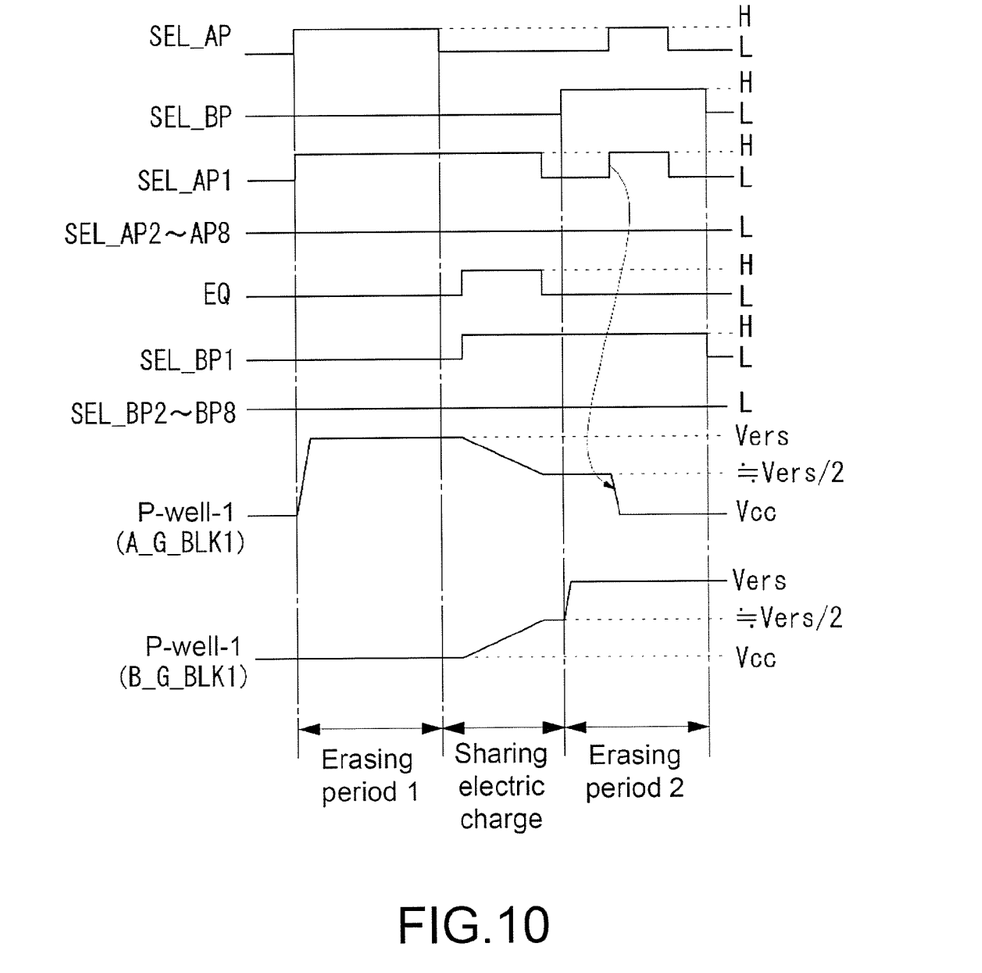
FIG. 10 is a time sequence diagram illustrating an exemplary erase operation of the flash memory of the present embodiment.

FIG. 10 is a time sequence diagram illustrating the erase operation of the block of the global block A_G_BLK1 of the memory plane 110A and then the erase operation of the block of the global block B_G_BLK1 of the memory plane 110B.

Firstly, during an erase period 1, the row decoder 160 and the row drive circuit 200 are based on the row address of the block that needs to be erased to select the global block A_G_BLK1 of the memory plane 110A and to select the block inside. Returning to the selection of the global block A_G_BLK1, as shown in FIG. 8, the transistor SEL_AP selected by the memory plane is turned on, and the transistor SEL_AP1 used for selecting the P-well-1 is turned on. All of the other transistors are turned off. As illustrated by the bias voltages in Table 1, a voltage 0V is provided to all of the word lines of the selected block, the erase voltage Vers generated by the internal voltage generating circuit 190 is provided to the Pwell-1 via the transistors SEL_AP and SEL_AP1 and the contact line 350. Preferably, the P-well-1 is precharged to the source voltage Vcc so as to shorten the time needed to increase the voltage.

Next, during the electric charge sharing period, the transistor SEL_AP is turned off, and then the equivalent transistor EQ and the transistor SEL_BP1 used for selecting the P-well-1 of the memory plane 110B are turned on. Therefore, the P-well-1 of the memory plane 110A and the P-well-1 of the memory plane 110B are electrically connected. At this time, the erase voltage Vers of the P-well-1 of the memory plane 110A is about 20V, and the source voltage Vcc of the P-well-1 of the memory plane 110B is about 3.3V. Therefore, the electric charge accumulated in the P-well-1 of the memory plane 110A is discharged to the P-well-1 of the memory plane 110B until the voltages of the two P-wells-1 are substantially equal to each other. The ideal voltage rising by the shared electric charge of the P-well is equal to ½ Vers, in fact, the voltage rising by the shared electric charge of the P-well is smaller than ½ Vers because of the loss caused by the load capacitance when discharging, etc.

The electric charge sharing period is completed, an erase period 2 is next, the transistor SEL_BP used for selecting the memory plane 110B is turned on, the erase voltage Vers generated by the internal voltage generating circuit 190 is provided to the P-well-1. The voltage of the P-well-1 after electric charge sharing is increased when the erase voltage Vers is applied, so the erasing power needed is reduced and voltage increasing time is also shortened. On the other hand, the transistor SEL_AP used for selecting the memory plane 110A and the transistor SEL_AP1 used for selecting the P-well-1 are turned on for a fixed time period, the electric charge of the P-well-1 is discharged to the internal voltage generating circuit 190 via the contact line 350 until the voltage of the P-well-1 becomes the source voltage Vcc.

In the erase operation of the flash memory illustrated in the present embodiment, the memory array of the flash memory has a plurality of memory planes, one memory plane includes a plurality of global blocks, one global block includes a plurality of blocks, but the invention is not limited to this structure of the memory array. For example, the memory array includes a plurality of blocks to constitute a typical flash memory, when the P-well of the block that is erased and the P-well of the block that is subsequently erased are in the adjacent relationship, the electric charge accumulated in the P-well of the block that is erased is discharged to the P-well of the block that is subsequently erased, so as to share the electric charge.

Next, the read-out operation is simply described. During the precharge period, the H level is supplied to the select line SEL_LBLe and 0V is supplied to the select line SEL_LBLo used for selecting a global block, a precharge voltage is supplied to the global bit line GBL, the precharge voltage is supplied to the imaginary power line VIR_e, 0V is supplied to the imaginary power line VIR_o, the select lines SEL_VIRe and SEL_VIRo are driven to H level for a fixed time period, the two even-numbered local bit lines LBL_e1 and LBL_e2 are precharged, and the two odd-numbered local bit lines LBL_o1 and LBL_o2 are set as 0V. Next, the select lines SEL_VIRe and SEL_VIRo are driven to L level, the even-numbered local bit line LBLe and the odd-numbered local bit lines LBLo are separate from the imaginary power lines VIR_e and VIR_o, the precharge period is completed.

In the selective discharge period of the string, the select line DSG is driven to Vcc, the bit line side select transistor is turned on, a voltage, such as a pass voltage Vpass, that is able to turn on a memory cell having data "0" is provided to the selected word line WL and the non-selected word line WL, and 0V is provided to the source line SL. At this time, the memory cell of the string of the selected block is charged by the electric charge from the even-numbered local bit line LBLe. Next, the selected word line WL is driven to 0V, the select line SGS is driven from 0V to Vcc, the source line side select transistor is turned on. Therefore, according to the storage status of the data of the memory cell, the electric charge of the string and the even-numbered local bit line LBLe is discharged to the source line SL. That is, in the discharge period of the string, the electric charge corresponding to the storage status of the memory cell is maintained in the even-numbered local bit lines LBL_e1 and LBL_e2.

In the read-out period, the select line SEL_e1 is driven to H level. In this period, the transistor Qe1 is turned on, the even-numbered local bit line LBL_e1 is connected to the global bit line GBL. Since the even-numbered local bit line LBL_e1 is 0V, the electric potential of the global bit line GBL is discharged to 0V. The page buffer/sense circuit 170 detects the electric potential or current of the global bit line GBL and maintains the result in the latch circuit. When the read-out operation of the even-numbered local bit line LBL_e1 is completed, the global bit line GBL is precharged again, and the select line SEL_e2 is driven to H level. In this period, the transistor Qe2 is turned on, the even-numbered local bit line LBL_e2 is connected to the global bit line GBL. Since the precharge voltage of the even-numbered local bit line LBL_e2 is maintained, the electric potential of the global bit line GBL is almost not changed. The page buffer/sense circuit 170 detects the electric potential or current of the global bit line GBL and maintains the result in the latch circuit.

Next, the program operation is simply described. In the precharge period, H level voltage is provided to the select line SEL_LBLe, 0V is provided to the select line SEL_LBLo, the page buffer/sense circuit 170 provides 0V to all of the global bit lines GBL. The precharge voltage is provided to the imaginary power lines VIR_e and VIR_o, the selected word line WL and the non-selected word line WL are driven to the pass voltage Vpass, Vcc is provided to the source line SL. Next, the select lines SEL_VIRe and SEL_VIRo are driven to H level, the two even-numbered local bit lines LBL_e1 and LBL_e2 are precharged, and the two odd-numbered local bit lines LBL_o1 and LBL_o2 are precharged. Subsequently, the select line SEL_VIRe is driven to L level, the even-numbered local bit line LBLe is separate from the imaginary power line VIR_e, the precharge period is completed.

In the selective discharge period of the string, a page buffer/sense circuit 170 connected to a global bit line GBL maintains a programming data having 4 bits. The global bit line GBL is set a voltage corresponding to the initial bit of the program data, in addition, the select line SEL_e1 is driven to H level. Therefore, the even-numbered local bit line LBL_e1 is connected to the global bit line GBL, the even-numbered local bit line LBL_e1 is discharged to 0V. Next, the global bit line GBL is set a voltage corresponding to the next bit of the program data. Subsequently, the select line SEL_e2 is driven to H level. Therefore, the transistor Qe2 is turned on, the even-numbered local bit line LBL_e2 is connected to the global bit line GBL, but the voltage of the even-numbered local bit line LBL_e1 is almost not changed. As a result, the program data is maintained in the even-numbered local bit lines LBL_e1 and LBL_e2.

Next, the program data about 15V~20V is applied to the selected word line. When the program operation of the selected memory cell of the two even-numbered local bit lines LBL_e1 and LBL_e2 is completed, the two odd-numbered local bit lines LBL_o1 and LBL_o2 are programmed next.

In the above-mentioned embodiment, the structure that the two even-numbered local bit lines and the two odd-numbered local bit lines are collectively connected to one global bit line GBL is represented, but the invention is not limited to this structure. More than m (m is a natural number greater than 3) even-numbered local bit lines and m odd-numbered local bit lines may be collectively connected to one global bit line GBL. For example, four even-numbered local bit lines and four odd-numbered local bit lines are collectively connected to one global bit line, thus one global bit line is shared by eight local bit lines. The increase of the number of the sharing local bit lines means that the electric charge maintained in the local bit lines is increased, and the plurality of local bit lines are rapidly and time-sharingly connected to the global bit line, so as to further achieve a high speed read-out operation and a high speed program operation.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A non-volatile semiconductor memory device, comprising:
    a memory array, comprising a plurality of global blocks, wherein one global block comprises a plurality of blocks, one block comprises a plurality of NAND type strings, and each of the plurality of global blocks is respectively formed inside a well;
    a global block selecting component, coupled to a row decoder to receive a plurality of global selecting signals, and configured to select one global block of the plurality of global blocks according to the global selecting signals;
    a block selecting component, coupled to the row decoder to receive a plurality of decoding signals, and configured to select one block from the plurality of blocks inside the global block selected by the global block selecting component according to the decoding signals;
    an erasing component, configured to erase the block selected by the block selecting component, wherein the erasing component applies an erase voltage to a well of the selected global block and applies a reference voltage to a word line of the selected block; and
    a plurality of selecting transistors, wherein each of the selecting transistors is coupled between one of the global blocks and an erase line, and each of the selecting transistors is controlled by one of the global selecting signals,
    wherein a first selecting transistor among the selecting transistors and a second selecting transistor among the selecting transistors are enabled to provide electric charges accumulated in a first well to a second well through the erase line in response to deterring that the selected block of the first well is completely erased and the selected block of the second well is to be subsequently erased.

2. The non-volatile semiconductor memory device as recited in claim 1, wherein the first well are adjacent to the second well.

3. The non-volatile semiconductor memory device as recited in claim 1, wherein the first well and the second well are in a predetermined relationship.

4. The non-volatile semiconductor memory device as recited in claim 1, wherein the memory array comprises a plurality of memory planes and each of the memory planes comprises a plurality of global blocks, and the first well and the second well are located in a same memory plane.

5. The non-volatile semiconductor memory device as recited in claim 1, wherein the memory array comprises a plurality of memory planes and each of the memory planes comprises a plurality of global blocks, and the first well and the second well are located in different memory planes.

6. The non-volatile semiconductor memory device as recited in claim 5, wherein the first well and the second well are located at a same position in the different memory planes.

7. The non-volatile semiconductor memory device as recited in claim 6, wherein the erasing component is configured to erase the block of the first well and the block of the second well at the same positions.

8. The non-volatile semiconductor memory device as recited in claim 1, wherein the erasing component comprises a transistor connected between the selected wells of the plurality of wells, the erasing component discharges the electric charge of the first well into the second well via enabling the transistor.

9. The non-volatile semiconductor memory device as recited in claim 1, wherein the first well is discharged from the erase voltage to a positive voltage, and the voltage of the second well is increased from the positive voltage by the shared electric charge.

10. The non-volatile semiconductor memory device as recited in claim 1, wherein the memory array comprises:
a first memory plane, comprising a plurality of first global blocks which are electrically coupled to a first erase line through a plurality of first selecting transistors;
a second memory plane, comprising a plurality of second global blocks which are electrically coupled to a second erase line through a plurality of second selecting transistors; and
an equivalent transistor, electrically coupled between the first erase line and the second erase line,
wherein the first well is located in the first memory plane, the second well is located in the second memory plane, and the electric charges accumulated in the first well are provided to the second well via the equivalent transistor.

11. The non-volatile semiconductor memory device as recited in claim 10, wherein the first selecting transistors and the second selecting transistors are controlled by the plurality of the global selecting signals outputted from the row decoder.

12. The non-volatile semiconductor memory device as recited in claim 1, wherein the memory array comprises:
a first memory plane, comprising a plurality of first global blocks which are electrically coupled to a first erase line through a plurality of first selecting transistors;
a second memory plane, comprising a plurality of second global blocks which are electrically coupled to a second erase line through a plurality of second selecting transistors;
a plurality of equivalent transistors, wherein each of the equivalent transistors is electronically coupled between a first well located on the first memory plane and a second well located on the second memory plane.

13. A non-volatile semiconductor memory device, comprising:
a memory array, comprising a plurality of wells, wherein a block comprising a NAND type string cell unit is formed in each of the wells;
a block selecting component, configured to select the block;
an erasing component, configured to erase the selected block, wherein the erasing component applies an erase voltage to a well of the selected block and applies a reference voltage to a word line of the selected block; and
a plurality of selecting transistors, wherein each of the selecting transistors is coupled between one of the wells and an erase line,
wherein a first selecting transistor among the selecting transistors and a second selecting transistor among the selecting transistors are enabled to provide electric charges accumulated in a first well to a second well through the erase line in response to determining that the selected block of the first well is completely erased and the selected block of the second well is to be subsequently erased.

* * * * *